(12) United States Patent
Bader et al.

(10) Patent No.: US 11,740,562 B2
(45) Date of Patent: Aug. 29, 2023

(54) SEALING DEVICE, COMPONENT AND LITHOGRAPHY APPARATUS

(71) Applicant: Carl Zeiss SMT GmbH, Oberkochen (DE)

(72) Inventors: Dieter Bader, Goeggingen (DE); Alexander Ostendorf, Langenau (DE); Ole Fluegge, Bartholomae (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 22 days.

(21) Appl. No.: 17/490,197

(22) Filed: Sep. 30, 2021

(65) Prior Publication Data

US 2022/0019150 A1    Jan. 20, 2022

Related U.S. Application Data

(63) Continuation of application No. PCT/EP2020/059305, filed on Apr. 1, 2020.

(30) Foreign Application Priority Data

Apr. 2, 2019 (DE) .......................... 102019204699.1

(51) Int. Cl.
| G03F 7/20 | (2006.01) |
| G03F 7/00 | (2006.01) |
| F16J 15/02 | (2006.01) |
| H05K 5/06 | (2006.01) |

(52) U.S. Cl.
CPC ........ *G03F 7/70808* (2013.01); *F16J 15/021* (2013.01); *H05K 5/061* (2013.01)

(58) Field of Classification Search
CPC ............. G03F 7/70808; G03F 7/70825; G03F 7/70833; G03F 7/70075; G03F 7/70891; G03F 7/70116; F16J 15/021; H05K 5/061; G02B 27/0983; G02B 5/09; G02B 27/0977; G02B 7/1815; G02B 7/182
See application file for complete search history.

(56) References Cited

U.S. PATENT DOCUMENTS

| 6,122,114 A | 9/2000 | Sudo et al. |
| 2011/0228244 A1 | 9/2011 | Mann |
| 2017/0108788 A1 | 4/2017 | Heintel et al. |

FOREIGN PATENT DOCUMENTS

| DE | 102014219770 A1 | 3/2016 |
| WO | WO2015144370 A1 | 10/2015 |

OTHER PUBLICATIONS

International Search Report and Written Opinion for corresponding PCT Appl No. PCT/EP2020/059305, dated Jul. 9, 2020.

*Primary Examiner* — Mesfin T Asfaw
(74) *Attorney, Agent, or Firm* — Fish & Richardson P.C.

(57) ABSTRACT

A sealing device seals a first component part of a lithography apparatus vis-à-vis a multiplicity of second component parts of the lithography apparatus. The sealing device includes a multiplicity of sealing rings and a multiplicity of connection locations. The sealing rings are connected to one another with the aid of the connection locations.

22 Claims, 15 Drawing Sheets

SEALING DEVICE, COMPONENT AND LITHOGRAPHY APPARATUS

CROSS-REFERENCE TO RELATED APPLICATIONS

The present application is a continuation of, and claims benefit under 35 USC 120 to, international application PCT/EP2020/059305, filed Apr. 1, 2020, which claims benefit under 35 USC 119 of German Application No. 10 2019 204 699.1, filed Apr. 2, 2019. The entire disclosure of these applications are incorporated by reference herein.

FIELD

The present disclosure relates to a sealing device for a lithography apparatus, to a component for a lithography apparatus including a sealing device of this type, and to a lithography apparatus including a sealing device of this type and/or a component of this type.

BACKGROUND

Microlithography is used for producing microstructured components, for example integrated circuits. The microlithography process can be performed using a lithography apparatus, which has an illumination system and a projection system. The image of a mask (reticle) illuminated via the illumination system is in this case projected via the projection system onto a substrate (for example a silicon wafer) which is coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are EUV lithography apparatuses that use light with a wavelength in the range from 0.1 nm to 30 nm, such as 13.5 nm. In the case of such EUV lithography apparatuses, because of the high absorption of light of this wavelength by most materials, reflective optical units, that is to say mirrors, are used instead of refractive optical units, such as lens elements.

An EUV lithography apparatus can include components having a cooling circuit, for example for cooling the respective component with water, or a purging circuit, for example for purging the respective component with a purge gas, such as with an inert gas. A component of this type can be a so-called actuation sensor unit, for example, used to deflect facets of a facet mirror, for example of a field facet mirror or of a pupil facet mirror. In this case, a so-called actuation sensor package can be assigned to each facet for the purpose of deflecting the facets. The actuation sensor packages are usually sealed in a fluid-tight manner vis-à-vis a main body or frame of the actuation sensor unit.

For sealing purposes, O-rings or sealing mats can be used as seals. In order to maintain the sealing function during operation and over the lifetime, the seal can be clamped onto the respective actuation sensor package via prestress or in a manner supported in the pressure direction. A centering of the seal can be obtained as a result. In this case, it can be taken into consideration that the seal has a yielding volume for the purpose of pressing it. The yielding volume can be created by keeping enough space available between an inner contour of the respective seal and the actuation sensor package. However, this space can interfere with a good centering of the seal.

SUMMARY

The present disclosure seeks to provide an improved sealing device.

In an aspect, the disclosure provides a sealing device for sealing a first component part of a lithography apparatus vis-à-vis a multiplicity of second component parts of the lithography apparatus is proposed. The sealing device includes a multiplicity of sealing rings, and a multiplicity of connection locations, wherein the sealing rings are connected to one another with the aid of the connection locations.

By virtue of the fact that the sealing rings are connected to one another with the aid of the connection locations, the mounting of the sealing device is simplified compared to a sealing device without such connection locations.

The sealing device can also be referred to as a sealing mat. A multiplicity of sealing rings can be provided which form a two-dimensional pattern or grid. The sealing rings can be arranged, for example, in the shape of a grid or in the shape of a pattern. A plurality of connection locations, for example four, can be assigned to each sealing ring. The connection locations can also be referred to as contact locations. The sealing rings can be connected to one another integrally, in particular materially in one piece, with the aid of the connection locations. "Integrally" means in the present case that the sealing rings together form a common component part, namely the sealing device. "Materially in one piece" means here that the sealing device is produced from the same material throughout. The sealing device can be produced from a plastics material. By way of example, a perfluoro rubber (FFKM) can be a suitable material. The sealing device can be cut out from a sheet or film of a suitable plastics material, for example, using a laser.

In some embodiments, the connection locations each include a yielding volume for pressing the respective sealing ring between the first component part and one of the second component parts.

By virtue of the fact that the yielding volume is provided, it is possible for the respective sealing ring always to be sufficiently pressed, with the result that leaks during mounting and also over the service life of the lithography apparatus can be prevented or at least significantly reduced. The yielding volume can be provided between an inner contour of the respective sealing ring and a second component part received in the inner contour. However, the yielding volume can also be provided directly in or at the respective connection location, for example in the form of a cutout, a groove, a hole or the like. Material of the sealing ring should be pressed into the yielding volume during the pressing of the respective sealing ring. The abovementioned inner contour of the sealing ring can have an arbitrary shape. The inner contour can be circular, oval, triangular, polygonal or the like. Furthermore, the inner contour—as will be explained below—can also be trefoiled. The yielding volume can be provided in or at the sealing device itself.

In some embodiments, each sealing ring includes an inner contour, in each of which a second component part is able to be received at least in sections, and wherein the yielding volume is formed by virtue of the inner contour widening at the connection locations.

The fact that the inner contour "widens" means in the present case that the inner contour, at least in an unpressed state of the respective sealing ring, does not bear against the corresponding second component part and thus stands away from the second component part, in particular. By virtue of the fact that the inner contour widens at the connection locations, a sufficiently large yielding volume for the pressing of the respective sealing ring can be provided at the connection locations.

In some embodiments, the inner contour includes a connection radius at the connection locations, wherein the inner contour includes an intermediate radius in each case between two adjacent connection locations, and wherein the intermediate radius and the connection radius differ from one another in terms of their absolute value in such a way that the inner contour widens at the connection locations and narrows between two adjacent connection locations.

By virtue of the fact that the inner contour narrows between two adjacent connection locations, a centering of the sealing rings at the respective intermediate radius is made possible. Thus, with the aid of the widening and the narrowing, it is possible simultaneously to ensure a sufficiently large yielding volume for the pressing of the sealing rings and a centering of the sealing rings at the second component parts.

In accordance with some embodiments of the sealing device, the latter includes a multiplicity of sealing rings, a multiplicity of connection locations, wherein the sealing rings are connected to one another with the aid of the connection locations, wherein each sealing ring includes an inner contour, in each of which a second component part is able to be received at least in sections, wherein the inner contour includes a connection radius at the connection locations, wherein the inner contour includes an intermediate radius in each case between two adjacent connection locations, and wherein the intermediate radius and the connection radius differ from one another in terms of their absolute value in such a way that the inner contour widens at the connection locations and narrows between two adjacent connection locations.

The inner contour is composed of a plurality of radii, for example. That is to say that, in some embodiments, the inner contour is not circular. The inner contour can also have any other geometry, as mentioned above. In the region of the connection locations, the inner contour has a widening or broadening and, in the region between the connection locations, the inner contour has a narrowing, constriction or restriction. This results in a trefoiled or trefoil-like geometry of the inner contour, deviating from the circular shape. The inner contour can therefore be referred to as "trefoiled" or "trefoil-like". The sealing device can be positioned between a sealing surface of the first component part and a sealing surface of the second component part and effects fluid-tight sealing vis-à-vis them.

The fact that the second component part is "able to be received" in the inner contour should be understood in the present case to mean that a respective sealing ring can be put onto the second component part, or vice versa. In this case, the second component part can have a circular-cylindrical base section, at which the sealing ring is centered with the aid of the intermediate radius.

As mentioned above, four connection locations can be provided. Accordingly, the inner contour also has four times the connection radius and four times the intermediate radius. Accordingly, there are, for example, also four pairs of adjacent connection locations, between each of which a connection radius is provided. The radii can transition into one another, such that the inner contour has no shoulders, but rather a curved shape.

The fact that the intermediate radius and the connection radius "differ" from one another should be understood to mean, in particular, that the intermediate radius is greater than the connection radius, or vice versa. A center point of the connection radius can be offset relative to a center point of the intermediate radius in such a way that the condition that the inner contour widens at the connection locations and narrows between two adjacent connection locations is met both if the connection radius is greater than the intermediate radius and if the connection radius is less than the intermediate radius.

In some embodiments, the intermediate radius is greater than the connection radius.

By way of example, the connection radius is approximately 5 millimeters. The intermediate radius can be approximately 11 to 12 millimeters.

In some embodiments, the inner contour includes a first intermediate radius and a second intermediate radius, wherein the first intermediate radius and the second intermediate radius are equal in magnitude or have different magnitudes.

The first intermediate radius can be greater than the second intermediate radius. Alternatively, the first intermediate radius can also be less than the second intermediate radius. With the aid of the different intermediate radii, it is possible, if the connection locations are positioned in a manner spaced apart from one another at different azimuth angles in an azimuth direction or circumferential direction, to take account of the fact that a shortening of the sealing ring by the factor of azimuth angle/360° is to be produced between two connection locations in order, during the mounting of the sealing device, to prevent the connection locations from moving azimuthally, which could otherwise lead to warpage of the sealing device. For the case where the azimuth angles are equal in magnitude, the first intermediate radius and the second intermediate radius can also be equal in magnitude. The connection locations can be constructed in each case symmetrically with respect to a line of symmetry assigned to the respective connection location. The azimuth angles are measured between the lines of symmetry of the connection locations. A respective center point of the connection radius lies on the line of symmetry of that connection location to which the connection radius is assigned.

In some embodiments, the second intermediate radius has a bigger magnitude than the first intermediate radius.

Alternatively, the second intermediate radius can also have a smaller magnitude than the first intermediate radius.

In some embodiments, two adjacent connection locations between which the first intermediate radius is provided and two adjacent connection locations between which the second intermediate radius is provided are arranged in a manner spaced apart at the same distance or at different distances from one another.

The connection locations can be positioned in a manner spaced apart from one another non-uniformly as viewed in the circumferential direction. That is to say that different azimuth angles are provided between the connection locations. In this case, the first intermediate radius is positioned between a pair of connection locations between which a smaller azimuth angle is provided. The second intermediate radius is provided between a pair of connection locations between which a larger azimuth angle is provided. For the case where the azimuth angles are equal in magnitude, the connection locations are also arranged in a manner spaced apart at an equal distance from one another.

In some embodiments, a center point of the intermediate radius is arranged offset relative to a center point of the connection radius.

The sealing ring can include a first plane of symmetry and a second plane of symmetry, with respect to which the sealing ring is constructed symmetrically. The planes of symmetry can be positioned perpendicularly to one another. The center point of the intermediate radius can be positioned eccentrically. The center point of the connection radius also can be positioned eccentrically. As mentioned above, the center point of the connection radius lies on the respective line of symmetry of the connection location.

In some embodiments, a center point of the first intermediate radius is arranged offset relative to the center point of the connection radius in an x-direction and a y-direction of the sealing ring, wherein a center point of the second intermediate radius is arranged offset relative to the center point of the connection radius in the x-direction and in the y-direction of the sealing ring.

For example, a coordinate system having a first spatial direction or x-direction, a second spatial direction or y-direction and a third spatial direction or z-direction is assigned to the sealing ring. The spatial directions are positioned perpendicularly to one another. The first plane of symmetry is spanned by the y-direction and the z-direction, for example. The second plane of symmetry is spanned by the x-direction and the z-direction, for example. The inner contour can run as two-dimensional geometry in the x-direction and the y-direction. The center point of the first intermediate radius can be positioned offset relative to the center point of the connection radius in the x-direction and the y-direction in such a way that the inner contour experiences a constriction in the region of the first intermediate radius, even though the first intermediate radius is greater than the connection radius. For example, the center point of the second intermediate radius is positioned offset relative to the center point of the connection radius in the x-direction and in the y-direction in such a way that the inner contour experiences a constriction in the region of the second intermediate radius, even though the second intermediate radius can be greater than the connection radius.

In some embodiments, center points of two first intermediate radii are arranged in a manner spaced apart from one another by a first distance in the y-direction, wherein center points of two second intermediate radii are arranged in a manner spaced apart from one another by a second distance in the x-direction, and wherein the first distance and the second distance are equal in magnitude or have different magnitudes.

For example, the center points of the two first intermediate radii can be positioned in the first plane of symmetry and outside the second plane of symmetry. The center points can be positioned mirror-symmetrically with respect to the second plane of symmetry. For example, the center points of the two second intermediate radii can be positioned in the second plane of symmetry and outside the first plane of symmetry. The center points of the second intermediate radii can be positioned mirror-symmetrically with respect to the first plane of symmetry. For the case where the azimuth angles are equal in magnitude, the first distance and the second distance can be equal in magnitude.

In some embodiments, the first intermediate radii and the second intermediate radii are arranged alternating along the inner contour.

This means that seen along the inner contour, each first intermediate radius is arranged between two second intermediate radii and vice versa. The two first intermediate radii are arranged vis-á-vis or with a peripheral angle of 180°. The same can be valid for the second intermediate radii.

In some embodiments, the inner contour includes a transition radius, wherein the intermediate radius transitions into the connection radius with the aid of the transition radius.

This can help ensure a continuously variable transition from the intermediate radius to the transition radius. The transition radius can be less than the intermediate radius and the connection radius.

In some embodiments, two yielding volumes are provided per connection location, wherein a connection web of the connection location is provided between the two yielding volumes, and wherein the connection web connects adjacent sealing rings to one another.

For example, the connection web connects the sealing rings to one another integrally, in particular materially in one piece.

In some embodiments, the yielding volume is a groove which completely penetrates through a wall thickness of the sealing device or which extends only to a defined depth into the wall thickness.

For the case where the groove penetrates through the wall thickness only to the defined depth, the groove can be rectangular or rounded in cross section. If the groove does not completely penetrate through the wall thickness, the groove can also extend through the connection web. The groove can include sidewalls running parallel to one another. The sidewalls can also be positioned obliquely with respect to one another, such that the groove is wedge-shaped.

In some embodiments, the yielding volume includes a multiplicity of holes which completely penetrate through a wall thickness of the sealing device or which extend only to a defined depth into the wall thickness.

The holes can all have the same diameter or different diameters. The holes can be arranged in a manner spaced apart from one another uniformly or non-uniformly. The holes can be arranged in one row or a plurality of rows.

In an aspect, the disclosure provides a component for a lithography apparatus. The component includes a first component part, a multiplicity of second component parts which are received at least in sections in the first component part, and a sealing device of this type.

By way of example, the component can be part of a beam shaping and illumination system or of a projection system of the lithography apparatus. The component can be a so-called Actuation Sensor Unit (ASU), for example, with the aid of which facets of a facet mirror, for example of a field facet mirror or of a pupil facet mirror, can be deflected. Such a facet mirror having deflectable facets can be part of the beam shaping and illumination system, for example. The first component part can be for example a main body or frame of the component. The first component part can include a cooling system for cooling the component, in particular the second component parts. The cooling system can be formed with the aid of cooling channels provided in the first component part. The second component part can be an Actuation Sensor Package (ASP), for example, which is suitable for deflecting a facet of a facet mirror as mentioned above. The second component parts can have a circular-cylindrical geometry at least in sections. With the aid of the sealing device, the second component parts can be sealed vis-à-vis the first component part in order to seal the cooling system with respect to surroundings of the component.

In some embodiments, the sealing rings are pressed in each case between the first component part and one of the second component parts in such a way that a respective yielding volume of the sealing device is at least partly filled with material of the respective sealing ring.

During the pressing of the sealing ring, the latter is pressed at least partly into the yielding volume. A permanent safeguard against leaks may be achieved as a result.

In some embodiments, the component includes a first component part, a multiplicity of second component parts which are received in the first component part at least in sections, a sealing device as explained above, wherein the inner contour, for the purpose of centering the respective sealing ring at one of the second component parts, bears against the second component part with the intermediate radius, and wherein the inner contour, for the purpose of providing a yielding volume between the inner contour and the second component part, stands away from the second component part at the connection radius.

The fact that the inner contour "stands away" from the second component part at the connection radius for the purpose of providing the yielding volume should be understood to mean, in particular, that the inner contour does not make contact with the second component part in the region of the connection radius. That is to say that the inner contour and the second component part are free of contact or do not touch at the connection radius.

In an aspect, the disclosure provides a lithography apparatus. The lithography apparatus concomitantly includes a sealing device as explained above and/or a component as explained above.

The lithography apparatus can be an EUV lithography apparatus or a DUV lithography apparatus. EUV stands for "extreme ultraviolet" and denotes a wavelength of the working light of between 0.1 nm and 30 nm. DUV stands for "deep ultraviolet" and denotes a wavelength of the working light of between 30 nm and 250 nm.

"A(n); one" in the present case should not necessarily be understood as restrictive to exactly one element. Rather, a plurality of elements, such as, for example, two, three or more, can also be provided. Any other numeral used here, too, should not be understood to the effect that there is a restriction to exactly the stated number of elements. Rather, numerical deviations upwards and downwards are possible, unless indicated to the contrary.

The embodiments and features described for the sealing device are correspondingly applicable to the proposed component and respectively to the proposed lithography apparatus, and vice versa.

Further possible implementations of the disclosure also include not explicitly mentioned combinations of features or embodiments that are described above or below with respect to the illustrative embodiments. In this case, a person skilled in the art will also add individual aspects as improvements or supplementations to the respective basic form of the disclosure.

Further advantageous configurations and aspects of the disclosure are the subject matter of the dependent claims and also of the exemplary embodiments of the disclosure described below. In the text that follows, the disclosure is explained in more detail on the basis of certain embodiments and with reference to the accompanying figures.

DESCRIPTION OF EXEMPLARY EMBODIMENTS

Identical elements or elements having an identical function have been provided with the same reference signs in the figures, unless indicated to the contrary. It should also be noted that the illustrations in the figures are not necessarily true to scale.

Figure 1A:
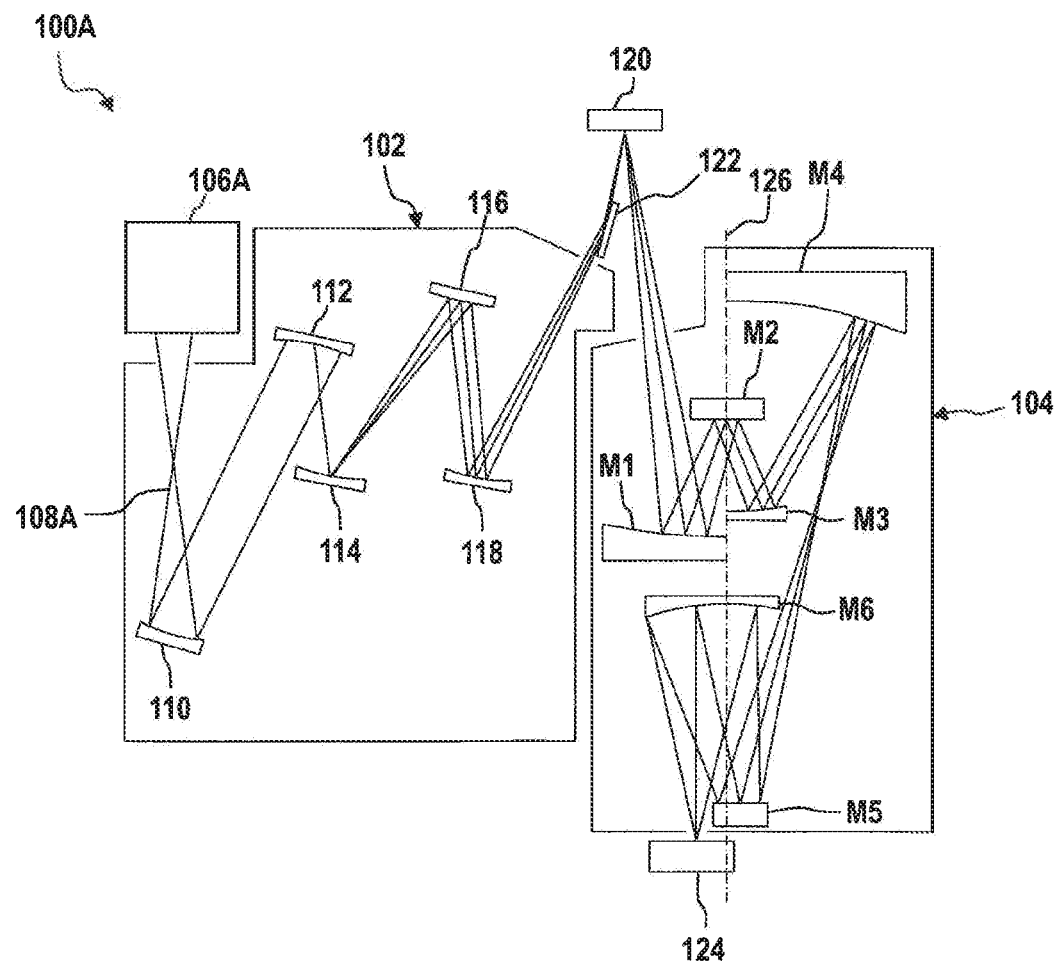
FIG. 1A shows a schematic view of an embodiment of an EUV lithography apparatus.

FIG. 1A shows a schematic view of an EUV lithography apparatus 100A, which includes a beam shaping and illumination system 102 and a projection system 104. In this case, EUV stands for "extreme ultraviolet" and denotes a wavelength of the working light of between 0.1 nm and 30 nm. The beam shaping and illumination system 102 and the projection system 104 are respectively provided in a vacuum housing (not shown), each vacuum housing being evacuated with the aid of an evacuation device (not shown). The vacuum housings are surrounded by a machine room (not shown), in which drive devices for mechanically moving or setting optical elements are provided. Moreover, electrical controllers and the like can also be provided in this machine room.

The EUV lithography apparatus 100A includes an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 illustrated in FIG. 1A has five mirrors 110, 112, 114, 116, 118. After passing through the beam shaping and illumination system 102, the EUV radiation 108A is guided onto a photomask (called a reticle) 120. The photomask 120 is likewise embodied as a reflective optical element and can be arranged outside the systems 102, 104. Furthermore, the EUV radiation 108A can be directed onto the photomask 120 via a mirror 122. The photomask 120 has a structure which is imaged onto a wafer 124 or the like in a reduced fashion via the projection system 104.

The projection system 104 (also referred to as projection lens) has six mirrors M1 to M6 for imaging the photomask 120 onto the wafer 124. In this case, individual mirrors M1 to M6 of the projection system 104 can be arranged symmetrically in relation to an optical axis 126 of the projection system 104. It should be noted that the number of mirrors M1 to M6 of the EUV lithography apparatus 100A is not restricted to the number represented. A greater or lesser number of mirrors M1 to M6 can also be provided. Furthermore, the mirrors M1 to M6 are generally curved on their front face for beam shaping.

Figure 1B:
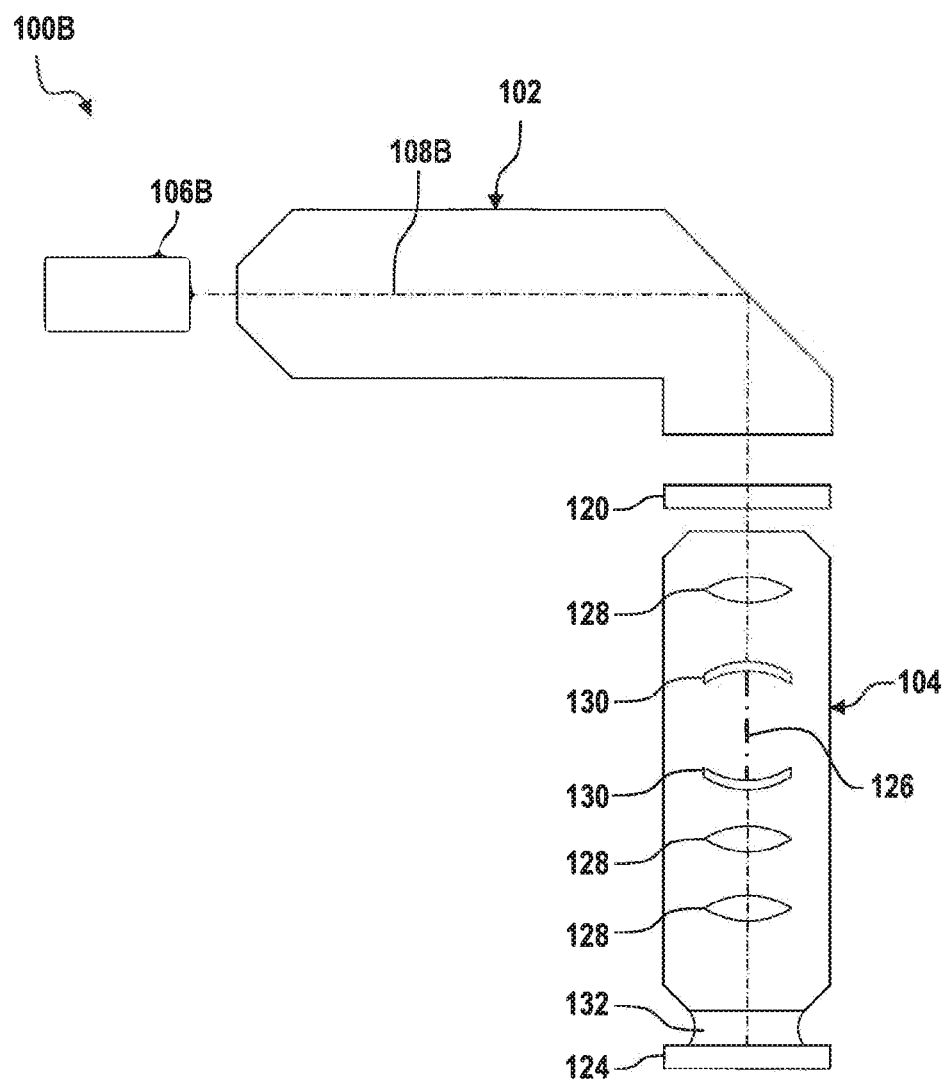
FIG. 1B shows a schematic view of an embodiment of a DUV lithography apparatus.

FIG. 1B shows a schematic view of a DUV lithography apparatus 100B, which includes a beam shaping and illumination system 102 and a projection system 104. In this case, DUV stands for "deep ultraviolet" and denotes a wavelength of the working light of between 30 nm and 250 nm. As has already been described with reference to FIG. 1A, the beam shaping and illumination system 102 and the projection system 104 can be arranged in a vacuum housing and/or surrounded by a machine room with corresponding drive devices.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 1B guides the DUV radiation 108B onto a photomask 120. The photomask 120 is embodied as a transmissive optical element and can be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to an optical axis 126 of the projection system 104. It should be noted that the number of lens elements 128 and mirrors 130 of the DUV lithography apparatus 100B is not restricted to the number represented. A greater or lesser number of lens elements 128 and/or mirrors 130 can also be provided. Furthermore, the mirrors 130 are generally curved on their front face for beam shaping.

An air gap between the last lens element 128 and the wafer 124 can be replaced by a liquid medium 132 which has a refractive index of >1. The liquid medium 132 can be high-purity water, for example. Such a construction is also referred to as immersion lithography and has an increased photolithographic resolution. The medium 132 can also be referred to as an immersion liquid.

Figure 2:
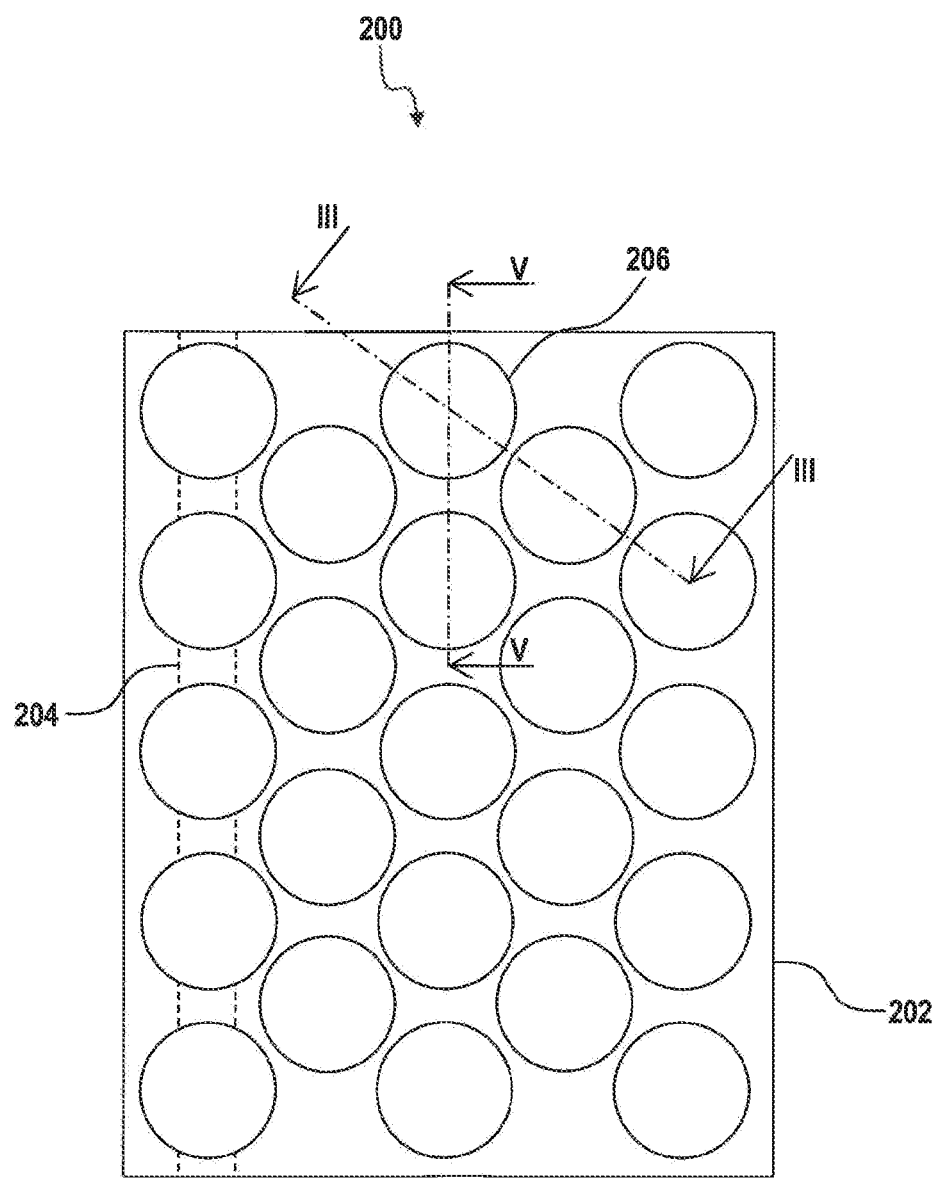
FIG. 2 shows a schematic view of an embodiment of a component for the lithography apparatus in accordance with FIG. 1A or FIG. 1B.

FIG. 2 shows a plan view of a component 200 for an EUV lithography apparatus 100A as explained above. By way of example, the component 200 can be part of the beam shaping and illumination system 102 or of the projection system 104 of the EUV lithography apparatus 100A. However, the component 200 can also be part of a DUV lithography apparatus 100B as explained above.

The component 200 can be a so-called Actuation Sensor Unit (ASU), for example, with the aid of which facets of a facet mirror, for example of a field facet mirror or of a pupil facet mirror, can be deflected. Such a facet mirror having deflectable facets can be part of the beam shaping and illumination system 102, for example.

The component 200 includes a first component part 202. The first component part 202 can be for example a main body or frame of the component 200. The first component part 202 can be produced from metal, such as copper, high-grade steel or aluminium. The first component part 202 can be actively cooled. "Actively cooled" should be understood in the present case to mean that a fluid, for example water, is guided through the first component part 202 in order to absorb heat there and transport it away. For this purpose, the first component part 202 can include a cooling system 204, for example a cooling circuit, which is illustrated highly schematically in FIG. 2. The cooling system 204 can be formed with the aid of cooling channels provided in the first component part 202.

The component 200 includes a multiplicity of second component parts 206, only one of which, however, is provided with a reference sign in FIG. 2. The second component part 206 can be an Actuation Sensor Package (ASP), for example, which is suitable for deflecting a facet of a facet mirror as mentioned above. In this case, a second component part 206 of this type can be assigned to each facet. A multiplicity of second component parts 206 can be provided. By way of example, hundreds of second component parts 206 can be provided. As shown in FIG. 2, the second component parts 206 are arranged in the shape of a grid or in the shape of a pattern. The second component parts 206 can have a circular-cylindrical geometry.

The second component parts 206 are received in the first component part 202 at least in sections and are sealed vis-à-vis the first component part. The second component parts 206 can be cooled with the aid of the cooling system 204. The first component part 202 has receiving sections, for example holes or recesses, in which the second component parts 206 are received in sections.

Figure 3:
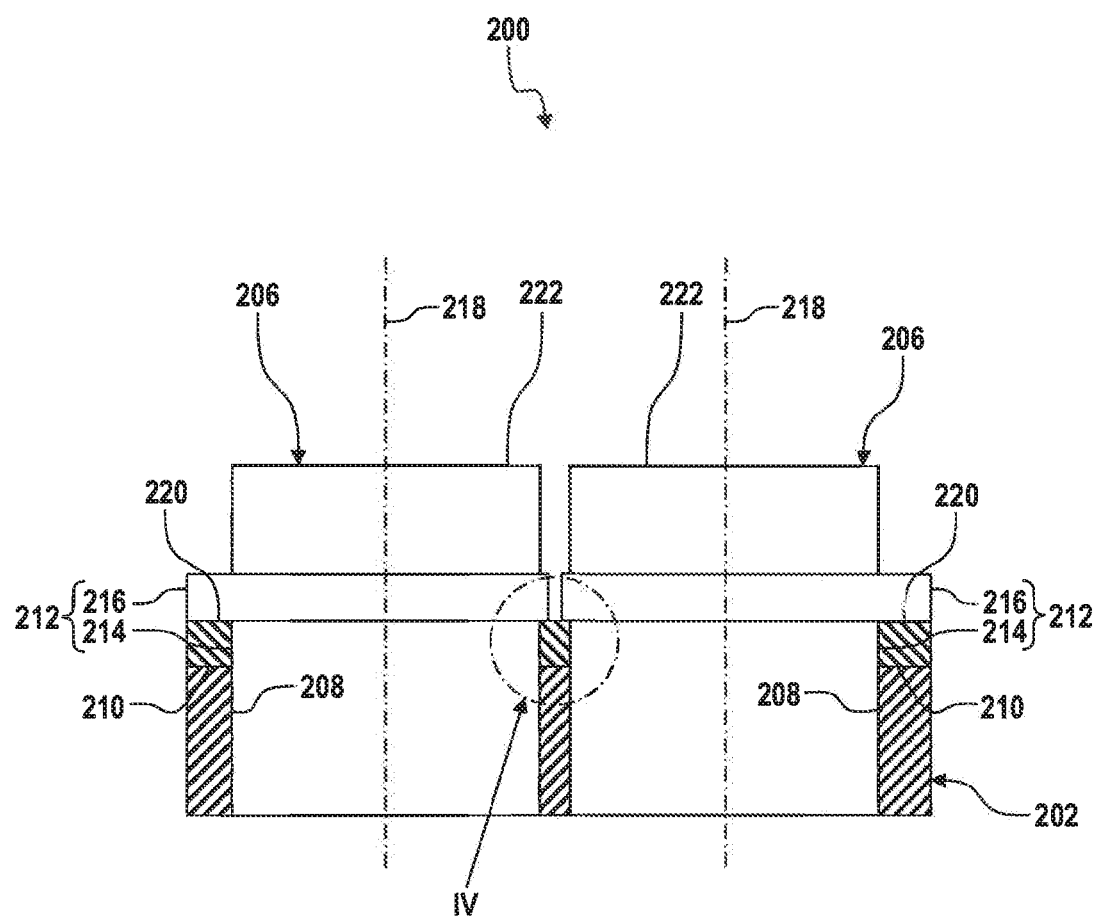
FIG. 3 shows a schematic sectional view of a component in accordance with the sectional line in FIG. 2.
Figure 4:
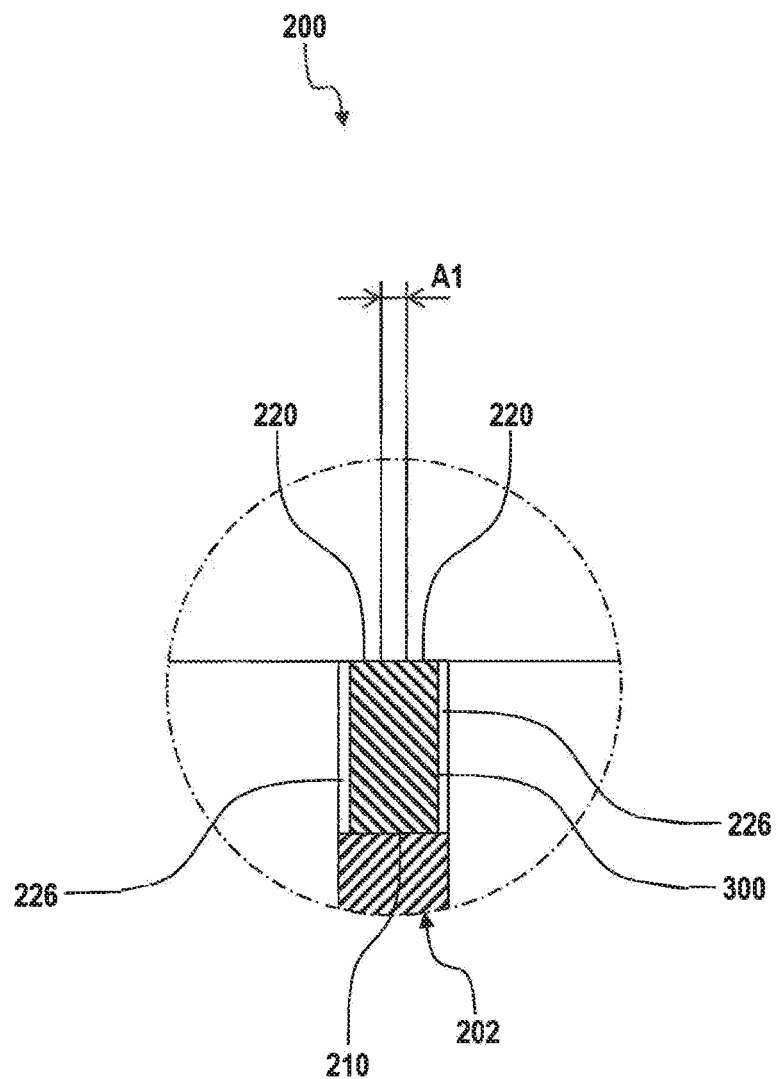
FIG. 4 shows a detail view IV in accordance with FIG. 3.

FIG. 3 shows a schematic section view through two second component parts 206 in accordance with the sectional line in FIG. 2. FIG. 4 shows the detail view IV in accordance with FIG. 3. Reference is made below to FIGS. 3 and 4 simultaneously.

As already mentioned, the first component part 202 includes receiving sections 208, in which the second component parts 206 are received. The receiving sections 208 can be embodied as holes in the first component part 202. The first component part 202 furthermore includes one sealing surface 210 or a plurality of sealing surfaces 210. For example, a sealing surface 210 of this type is assigned to each second component part 206. The sealing surfaces 210 each extend circularly around the corresponding second component part 206. As shown in FIG. 3, the second component parts 206 each project above the sealing surface 210 assigned thereto.

Each second component part 206 includes a main body 212 having a cylindrical base section 214 and a flange section 216 extending around the base section 214. The base section 214 can be constructed rotationally symmetrically with respect to a center axis or axis of symmetry 218. The flange section 216 is not constructed rotationally symmetrically with respect to the axis of symmetry 218.

The flange section 216 can be polygonal. As viewed along the sectional line a distance A1 between flange sections 216 of two adjacent second component parts 206 is only a few hundred µm. By way of example, the distance A1 can be 200 µm. The base section 214 is received in the receiving section 208 and projects beyond the corresponding sealing surface 210. The flange section 216 includes in each case a sealing surface 220 respectively facing a corresponding sealing surface 210 of the first component part 202.

A ring body 222 is placed onto the main body 212. The ring body 222 is closed off with a ceramic plate towards the top in the orientation in FIG. 3. The ceramic plate can be soldered into the ring body 222. The ring body 222 can be welded to the main body 212. Each second component part 206 includes a sensor system and an actuator. The actuator can include a plurality of coils.

The second component parts 206, for example the sealing surfaces 220, are sealed vis-à-vis the first component part 202, for example the sealing surfaces 210, with the aid of a sealing device 300. For this purpose, the sealing device 300 is positioned and pressed between the sealing surfaces 210, 220. A yielding volume 226 for the pressing of the sealing device 300 is provided in each case between the sealing device 300 and the base sections 214. The yielding volume 226 can be referred to as a compensation volume.

Figure 5:
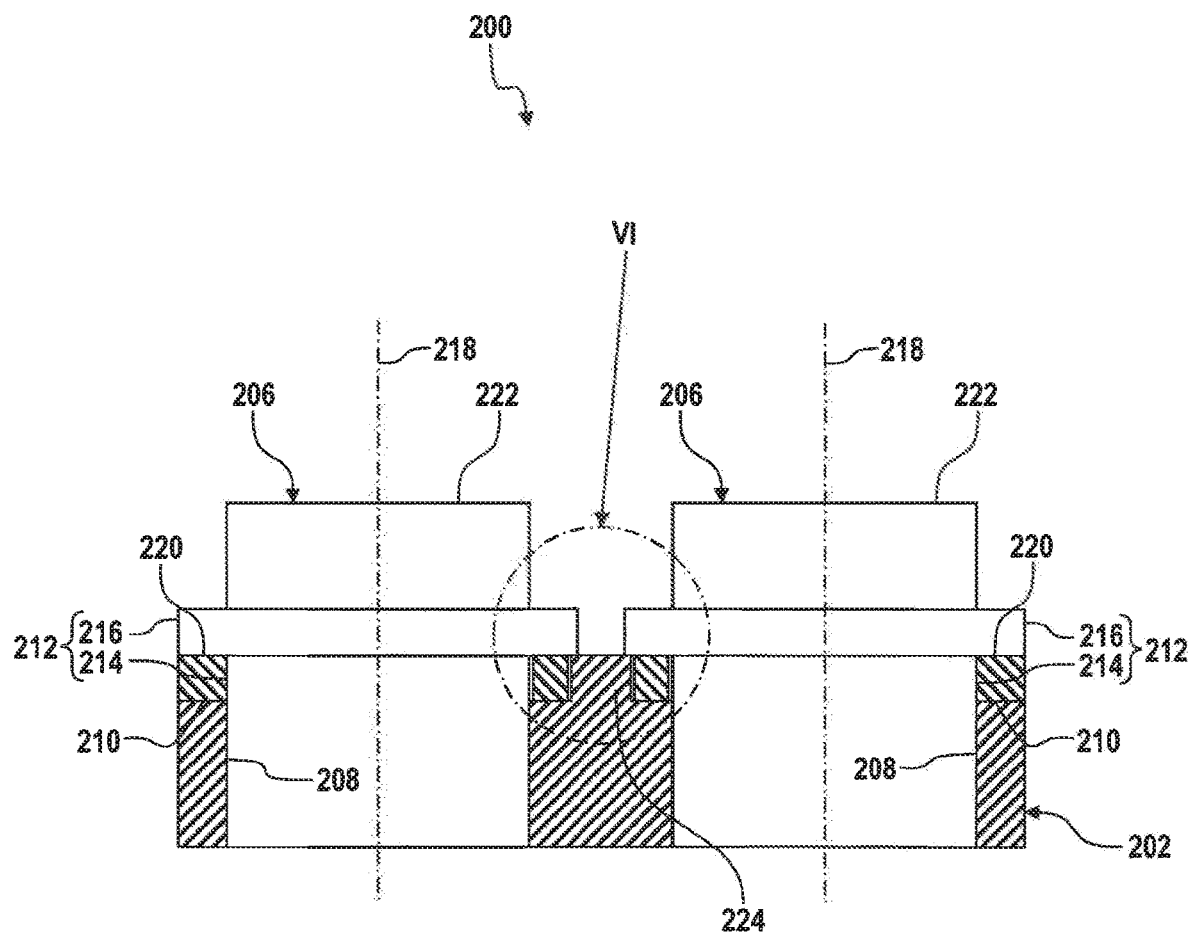
FIG. 5 shows a schematic sectional view of the component in accordance with the sectional line V-V in FIG. 2.
Figure 6:
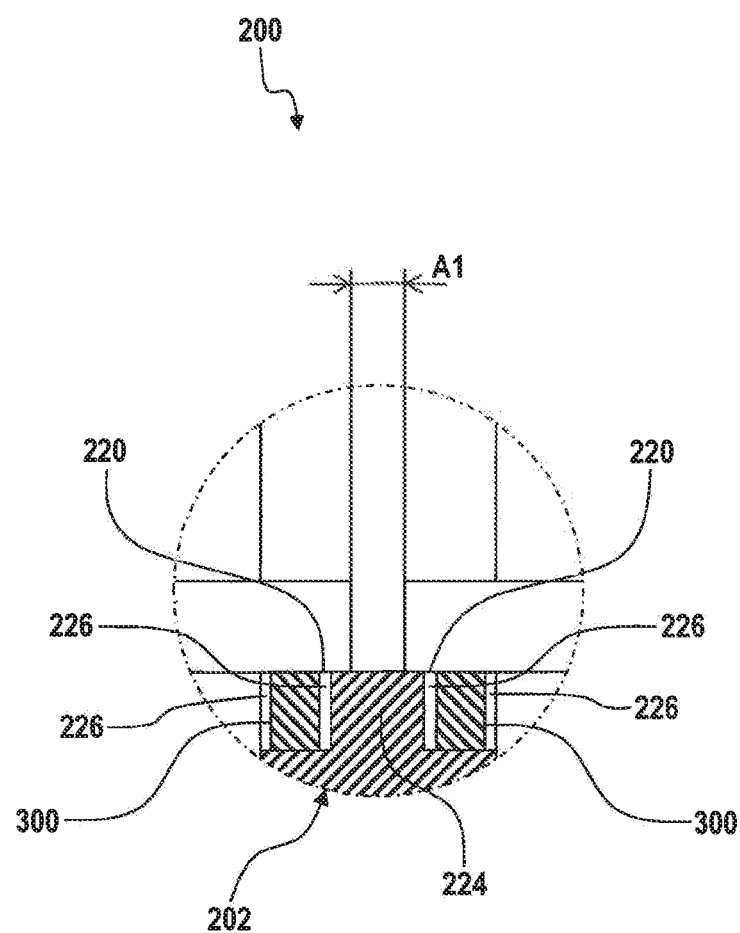
FIG. 6 shows a detail view VI in accordance with FIG. 5.

FIG. 5 shows a schematic sectional view through two second component parts 206 in accordance with the sectional line V-V in FIG. 2. FIG. 6 shows the detail view VI in accordance with FIG. 5. Reference is made below to FIGS. 5 and 6 simultaneously.

As viewed along the sectional line V-V, the first component part 202 extends out over the sealing surfaces 210 with a bearing section 224. The second component parts 206 bear on the bearing sections 224 in such a way that the sealing surfaces 210, 220 are positioned at a defined distance away from one another. The distance A1 is significantly larger when viewed along the sectional line V-V than when viewed along the sectional line III-III.

The comparison of FIGS. 3 and 4 with FIGS. 5 and 6 shows that very little structural space is present along the sectional line There is a very small overlap between the sealing surfaces 220 of the second component parts 206 and the sealing device 300. A decentration of the sealing device 300 in relation to the respective axis of symmetry 218 can easily lead to leakage for this reason. Furthermore, between adjacent second component parts 206, there is also only a very small or almost no yielding volume 226 for the pressing of the sealing device 300. Therefore, leaks can occur between two adjacent second component parts 206.

Along the sectional line V-V, by contrast, the ridge-shaped bearing section 224 is provided between two adjacent second component parts 206, the flange sections 216 of the second component parts 206 being supported on the bearing section. The sealing device 300 extends between the bearing section 224 and the base sections 214 of the main body 212 of the respective second component part 206. Significantly more structural space is present between adjacent second component parts 206 in comparison with a view along the sectional line There is a significantly larger overlap between the sealing surfaces 220 of the second component parts 206 and the sealing device 300. Therefore, a decentration of the sealing device 300 is rather noncritical here with regard to leaks. The yielding volume 226 for the pressing of the sealing device 300 is also significantly larger as viewed along the sectional line V-V.

If an internal diameter of the sealing device 300 is then increased in order to enlarge the yielding volume 226, the centering of the sealing device 300 is no longer ensured, however. The lack of centering of the sealing device 300 can have the effect that in the view along the sectional line the sealing device 300 bears against one of two adjacent second component parts 206 and is spaced apart by double the distance from the other of the two second component parts 206. Leaks can occur on account of the small overlap between the sealing surface 220 and the sealing device 300. No overlap at all between the sealing surface 220 and the sealing device 300 occurs in the worst case. In general, it is desirable to avoid this.

Figure 7:
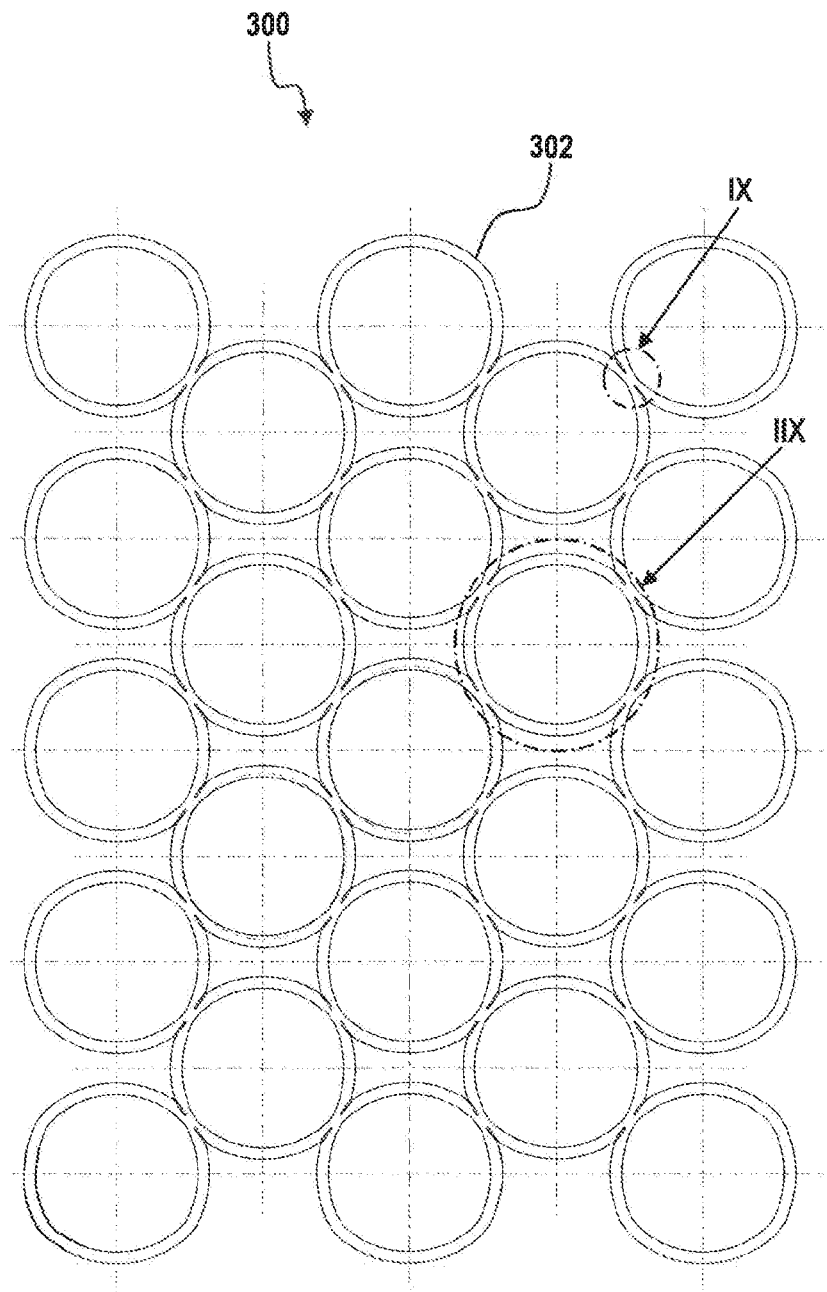
FIG. 7 shows a schematic view of an embodiment of a sealing device for the component in accordance with FIG. 2.

The small structural space between the second component parts 206 does not permit the sealing device 300 to be separated into individual sealing rings, for example into O-rings. Furthermore, individual sealing rings cannot be prevented from tilting away on account of the small structural space. Therefore, the sealing device 300, as shown in FIG. 7, is produced as a sealing mat, which is cut out from a suitable plastics material with the aid of a laser, for example. By way of example, a perfluoro rubber (FFKM) can be used as suitable material.

As shown in FIG. 7, the sealing device 300 includes a multiplicity of sealing rings 302 connected to one another, only one of which, however, is provided with a reference sign in FIG. 7. By virtue of the fact that the sealing rings 302 are connected to one another, the sealing rings 302 are prevented from tilting away.

Figure 8:
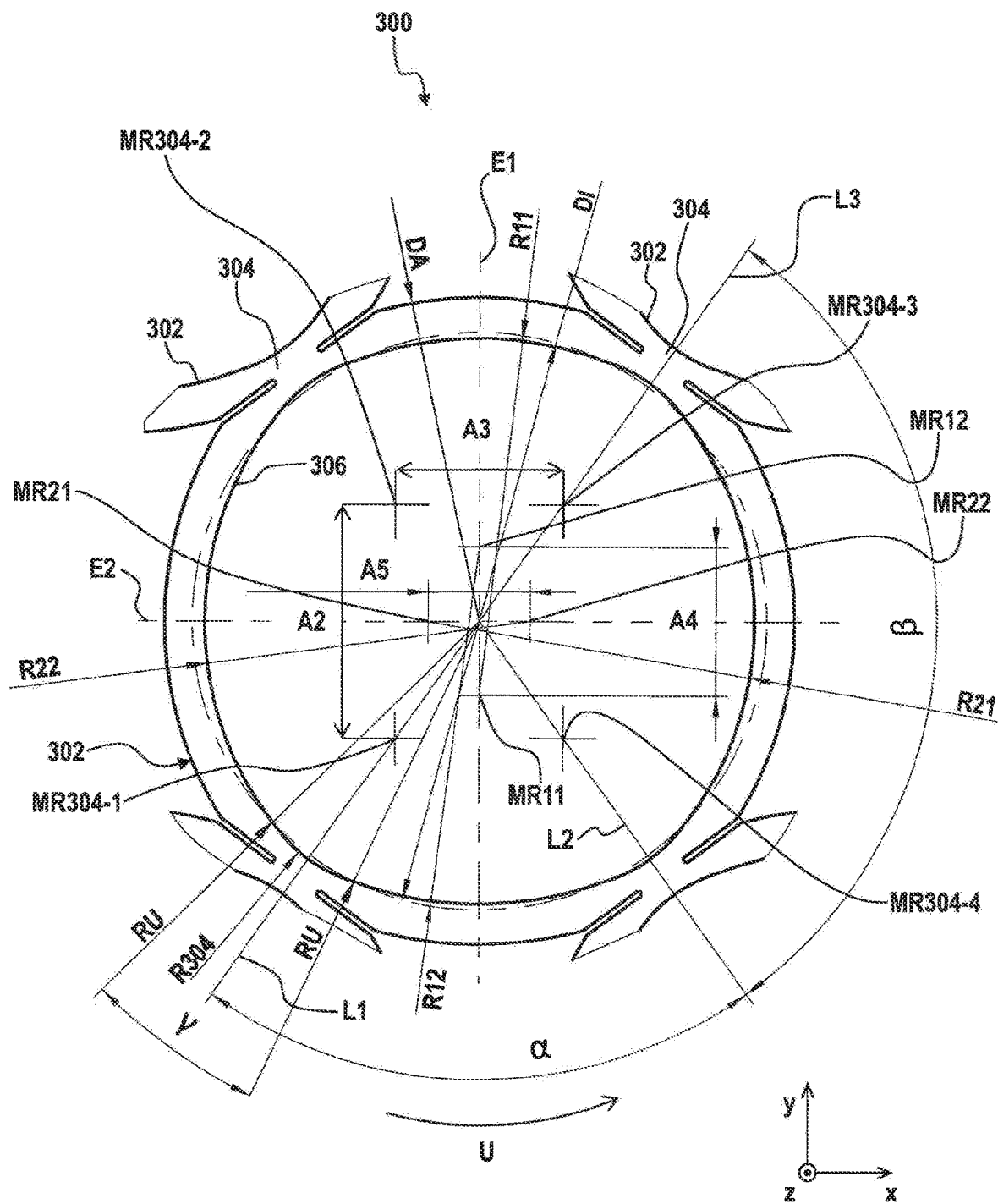
FIG. 8 shows a detail view IIX in accordance with FIG. 7.

FIG. 8 shows the detail view IIX in accordance with FIG. 7. The sealing rings 302 are connected to one another at connection locations 304, only two of which are provided with a reference sign in FIG. 8. The sealing device 300 is thus an integral component part, in particular one which is materially in one piece. "Integral" should be understood to mean in the present case that the sealing device 300 forms a single component part, which is not constructed from mutually separate component parts. That is to say that the sealing rings 302 are fixedly connected to one another, wherein the totality of all the sealing rings 302 forms the sealing device 300. "Materially in one piece" should be understood in the present case to mean that the sealing device 300 is an integral component part produced from the same material throughout.

The sealing rings 302 each have an external diameter DA, which is constant and which is flattened only in the region of the connection locations 304. For the case where the sealing rings 302 are embodied such that they each also have a constant internal diameter chosen in such a way that a centering on the respective base section 214 of the second component parts 206 is effected, the problem arises that, as viewed along the sectional line in FIG. 2, almost no yielding volume 226 for the pressing of the sealing device 300 is present. Consequently, the sealing device 300 cannot be pressed sufficiently between adjacent second component parts 206.

This can have the consequence that either the sealing device 300 is damaged, which can lead to leaks, or a desired installation position of the respective second component part 206 cannot be attained. This last can lead to position errors in a height direction (z-error) of the component 200. In order to obtain a sufficient yielding volume 226, the internal diameter of the sealing rings 302 can be increased, such that a sufficiently large yielding volume 226 is kept available between the second component parts 206 and the sealing device 300. However, this has the disadvantage that a sufficient centering at the base sections 214 of the second component parts 206 is not ensured. The sealing rings 302 then do not bear circumferentially against the base sections 214, which can lead to leaks over time or directly in the course of mounting.

In order then to obtain a sufficiently large yielding volume 226 and a good centering at the same time, the sealing rings 302 each include an inner contour 306 which is not circular, but rather, as will be explained below, is trefoiled. That is to say that the sealing rings 302 have a varying internal diameter rather than a constant internal diameter. Reference is made below to just one sealing ring 302. A theoretical internal diameter DI of the sealing ring 302 is illustrated by a dashed line in FIG. 8. The internal diameter DI corresponds to an external diameter of the base section 214 of the second component parts 206.

Each sealing ring 302 includes a first plane of symmetry E1 and a second plane of symmetry E2. The planes of symmetry E1, E2 are positioned perpendicularly to one another and intersect one another. The sealing ring 302 is constructed symmetrically, for example mirror-symmetrically, both with respect to the first plane of symmetry E1 and with respect to the second plane of symmetry E2. The diameters DA, DI have their center point on a line of intersection of the two planes of symmetry E1, E2. A coordinate system having a first spatial direction or x-direction x, a second spatial direction or y-direction y and a third spatial direction or z-direction z is assigned to the sealing ring 302. The directions x, y, z are positioned perpendicularly to one another.

Furthermore, an azimuth direction or circumferential direction U is also assigned to the sealing ring 302. The circumferential direction U can be oriented in the clockwise or anticlockwise direction. The circumferential direction U is oriented in the anticlockwise direction in FIG. 8. The circumferential direction U runs along the inner contour 306.

The connection locations 304 are arranged mirror-symmetrically both with respect to the first plane of symmetry E1 and with respect to the second plane of symmetry E2. A respective azimuth angle α, β is provided between two adjacent connection locations 304. The azimuth angle α can be referred to as first azimuth angle. The azimuth angle β can be referred to as second azimuth angle. The azimuth angle β is greater than the azimuth angle α. By way of example, the azimuth angle α is approximately 71° and the azimuth angle β is approximately 108°. The azimuth angle α is provided in each case between two connection locations 304 arranged mirror-symmetrically with respect to the first plane of symmetry E1. The azimuth angle β is provided in each case between two connection locations 304 arranged mirror-symmetrically with respect to the second plane of symmetry E2.

The sealing ring 302 includes a connection radius R304 at the connection locations 304. The inner contour 306 thus has the connection radius R304 in the region of the connection locations 304. That is to say that four connection radii R304 are provided, only one of which, however, is shown in FIG. 8. A respective center point MR304-1 to MR304-4 of the connection radius R304 lies outside the planes of symmetry E1, E2. Four center points MR304-1 to MR304-4 are provided, which lie on lines of symmetry L1 to L3 of the connection locations 304. Each connection location 304 is assigned a line of symmetry L1 to L3, wherein only three lines of symmetry L1 to L3 are shown in FIG. 8. The connection locations 304 are constructed in each case symmetrically with respect to the lines of symmetry L1 to L3. In other words, the lines of symmetry L1 to L3 run centrally through the connection locations 304. The azimuth angles α, β are plotted between the lines of symmetry L1 to L3.

The center points MR304-1 to MR304-4 are positioned mirror-symmetrically with respect to the planes of symmetry E1, E2. The center points MR304-1, MR304-4 and the center points MR304-2, MR304-3 are positioned in a manner spaced apart by a distance A2 from one another in the y-direction y. The center points MR304-1, MR304-2 and the center points MR304-3, MR304-4 are positioned in a manner spaced apart by a distance A3 from one another in the x-direction x. The distance A2 is greater than the distance A3.

The respective connection radius R304 extends over an azimuth angle γ in the circumferential direction U. The azimuth angle γ is 20°, for example. For the case where the azimuth angles α, β are each 90°, the distances A2, A3 are equal in magnitude. The connection radius R304 is less than half the internal diameter DI.

The inner contour 306 has a respective first intermediate radius R11, R12 between two connection locations 304 which are adjacent in the x-direction x. The inner contour 306 includes two first intermediate radii R11, R12. The first intermediate radii R11, R12 are situated respectively at the top and bottom in the orientation in FIG. 8. The first intermediate radii R11, R12 are each greater than the connection radius R304. It thus holds true that: R11, R12>R304.

A respective center point MR11, MR12 of the first intermediate radii R11, R12 is situated on the first plane of symmetry E1 and is offset respectively upwards and downwards in relation to the second plane of symmetry E2 in the orientation in FIG. 8. As viewed in the y-direction y, the center points MR11, MR12 of the first intermediate radii R11, R12 are positioned in a manner spaced apart by a distance A4 from one another. In this case, the center point MR11 is assigned to the first intermediate radius R11. The center point MR12 is assigned to the first intermediate radius R12.

The inner contour 306 includes a respective second intermediate radius R21, R22 between two connection locations 304 which are adjacent in the y-direction y. The inner contour 306 includes two second intermediate radii R21, R22. The second intermediate radii R21, R22 are situated respectively on the left and right in the orientation in FIG. 8. The second intermediate radii R21, R22 are in each case greater than the connection radius R304 and less than the first intermediate radii R11, R12. It thus holds true that: R11, R12>R21, R22>R304. However, other suitable size relationships can also be chosen. The intermediate radii R11, R12, R21, R22 are greater than half the internal diameter DI.

A respective center point MR21, MR22 of the second intermediate radii R21, R22 is situated on the second plane of symmetry E2 and is offset respectively towards the left and right in relation to the first plane of symmetry E1 in the orientation in FIG. 8. As viewed in the x-direction x, the center points MR21, MR22 of the second intermediate radii R21, R22 are positioned in a manner spaced apart by a distance A5 from one another. In this case, the center point MR21 is assigned to the second intermediate radius R21. The center point MR22 is assigned to the second intermediate radius R22. The distance A4 is greater than the distance A5. For the case where the azimuth angles α, β are each 90° and thus equal in magnitude, the distances A4, A5 are equal in magnitude. Accordingly, the intermediate radii R11, R12, R21, R22 can also be equal in magnitude.

The inner contour 306 furthermore includes optional transition radii RU, with the aid of which the intermediate radii R11, R12, R21, R22 transition into the respective connection radius R304. In each case two transition radii RU are provided per connection location 304. The transition radii RU can be identical, but can also be embodied individually. The transition radii RU provide for a continuously variable transition from the respective connection radius R304 into the intermediate radii R11, R12, R21, R22.

The prestress of the sealing ring 302 on the base section 214 of the respective second component part 206 is proportional to the azimuth angle α, β. Given an azimuth angle α of 71°, by way of example, a shortening of the sealing ring 302 between the corresponding connection locations 304 by a/360° or 71°/360° is involved. Given different distances or different azimuth angles α, β, mutually different first intermediate radii R11, R12 and second intermediate radii R21, R22 are chosen, as mentioned above. It is thereby possible to prevent the connection locations 304 from moving azimuthally during mounting and the sealing device 300 from warping as a result.

By virtue of the fact that the inner contour 306 has the connection radius R304 in the region of the connection locations 304, the connection radius being chosen such that it is less than the external diameter of the base section 214 of the second component parts 206 and thus the internal diameter DI, a sufficiently large yielding volume 226 for the pressing of the sealing ring 302 can be provided at the connection locations 304.

In the region between the connection locations 304 at which the intermediate radii R11, R12, R21, R22 are provided, by contrast, the inner contour 306 experiences a constriction or narrowing, such that the inner contour 306 bears against the base section 214 and can be centered there. Consequently, between the connection locations 304, the inner contour 306 bears against the base section 214 with a prestress. The narrowing of the inner contour 306 between the connection locations 304 and the widening of the inner contour at the connection locations 304 result in the inner contour 306 having the trefoiled or trefoil-like design mentioned above.

Figure 9:
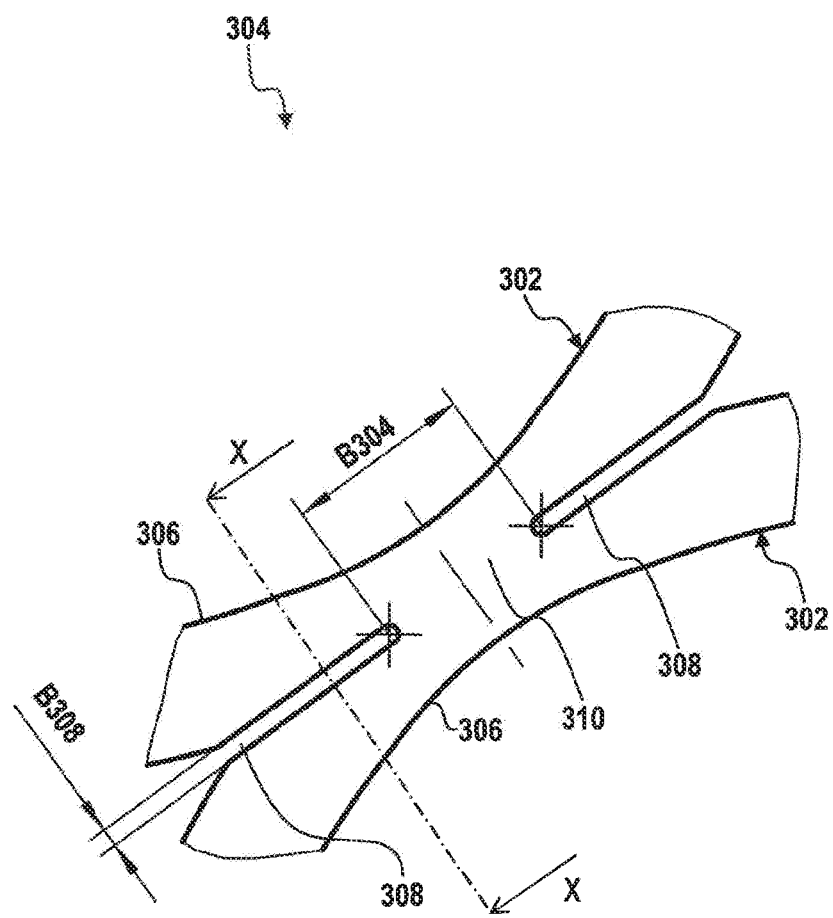
FIG. 9 shows a detail view IX in accordance with FIG. 7.

FIG. 9 shows the detail view IV in accordance with FIG. 7. FIG. 7 shows a connection location 304 between two sealing rings 302 in detail. A respective yielding volume 308 is provided at the connection location 304 on both sides, the yielding volume, like the yielding volume 226, enabling the sealing rings 302 to be pressed. The yielding volume 308 can be referred to as a compensating volume. Unlike the yielding volume 226, however, the yielding volumes 308 are provided directly at the sealing device 300. A connection web 310 is provided between the yielding volumes 308, the connection web connecting adjacent sealing rings 302 to one another integrally. The connection location 304 itself has a width B304 at the connection web 310. The width B304 can be two millimeters, for example.

The yielding volumes 308 can be embodied as flattened portions of the respective external diameter DA of the sealing rings 302. That is to say that the external diameters DA of adjacent sealing rings 302 do not transition into one another. By way of example, the yielding volumes 308 are embodied in each case as a cutout or groove extending completely through a wall thickness W300 (FIG. 10) of the sealing device 300. In this case, the groove-type yielding volumes 308 can have a width B308. The width B308 can be for example 0.1 to 0.3 millimeter, such as 0.2 millimeter. The wall thickness W300 can be 1 to 3 millimeters, such as 2 millimeters.

Figure 10:
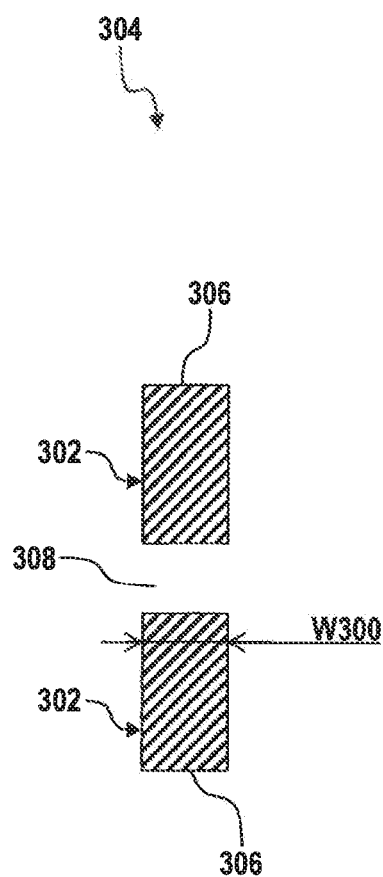
FIG. 10 shows a schematic sectional view of a sealing device in accordance with the sectional line X-X in FIG. 9.
Figure 11:
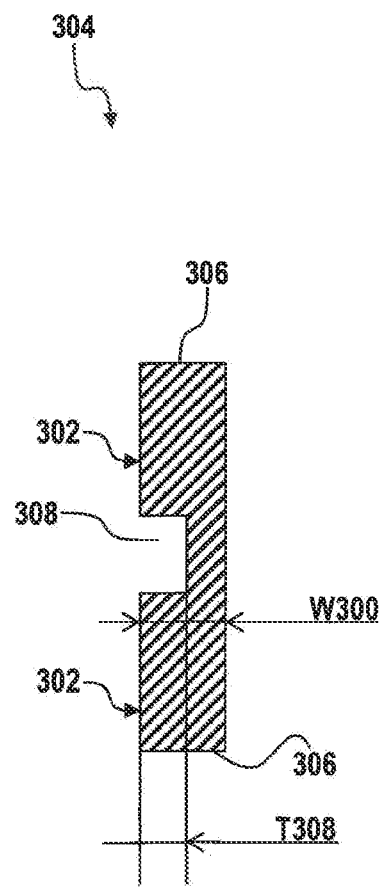
FIG. 11 shows a schematic sectional view of an embodiment of a sealing device for the component in accordance with FIG. 2.

FIG. 11 shows a development of the connection location 304 explained with reference to FIGS. 9 and 10. In contrast to FIGS. 9 and 10, the yielding volumes 308 do not extend completely through the wall thickness W300, but rather only to a depth T308. The depth T308 can be 1 millimeter, for example.

FIG. 12 shows once again the detail view IV in accordance with FIG. 7, but a development of the connection location 304 shown in FIGS. 9 and 10 is illustrated in FIG. 12. In this case, the yielding volumes 308 are not embodied as cutouts or grooves. Rather, the yielding volumes 308 include a multiplicity of holes 312, 314, 316 positioned next to one another, only three of which, however, are provided with a reference sign in FIG. 12. The number of holes 312, 314, 316 is arbitrary. By way of example, it is possible to provide six holes 312, 314, 316 of this type per yielding volume 308.

Figure 12:
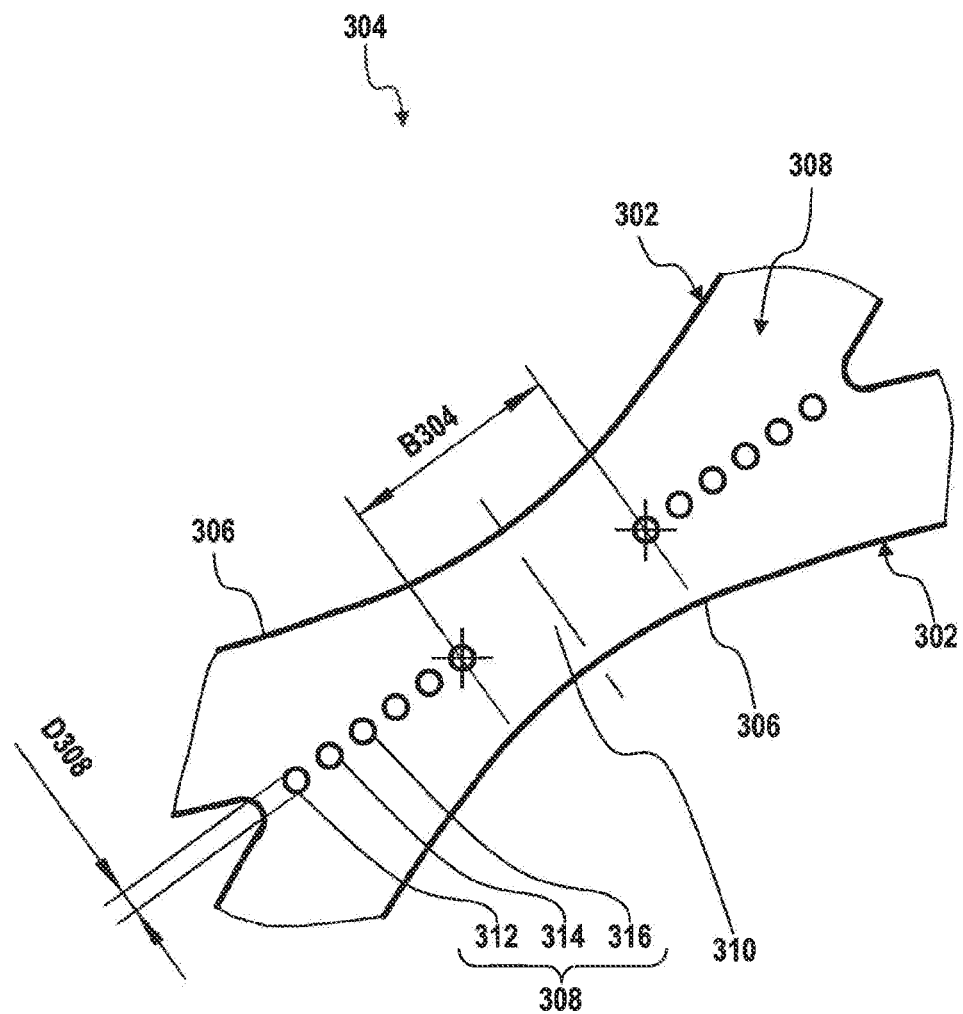
FIG. 12 shows a schematic detail view of an embodiment of a sealing device for the component in accordance with FIG. 2.

The holes 312, 314, 316 can be circular and have a diameter D308 in each case. However, the holes 312, 314, 316 can also have any other geometry. By way of example, the holes 312, 314, 316 can also be oval or polygonal. The diameter D308 can be 0.2 millimeter, for example. The holes 312, 314, 316 can all have the same diameter D308 or mutually different diameters D308. The holes 312, 314, 316 can be arranged in one row, as shown in FIG. 12. Alternatively, the holes 312, 314, 316 can also be arranged in a plurality of rows. The holes 312, 314, 316 can be positioned in a manner spaced apart from one another uniformly or non-uniformly.

The connection location 304 itself, as shown in FIG. 12, along the width B304, that is to say at the connection web 310, can be free of holes 312, 314, 316 or hole-free or holeless. The holes 312, 314, 316 can extend through the entire wall thickness W300 or only to the depth T308 explained above.

Figure 13:
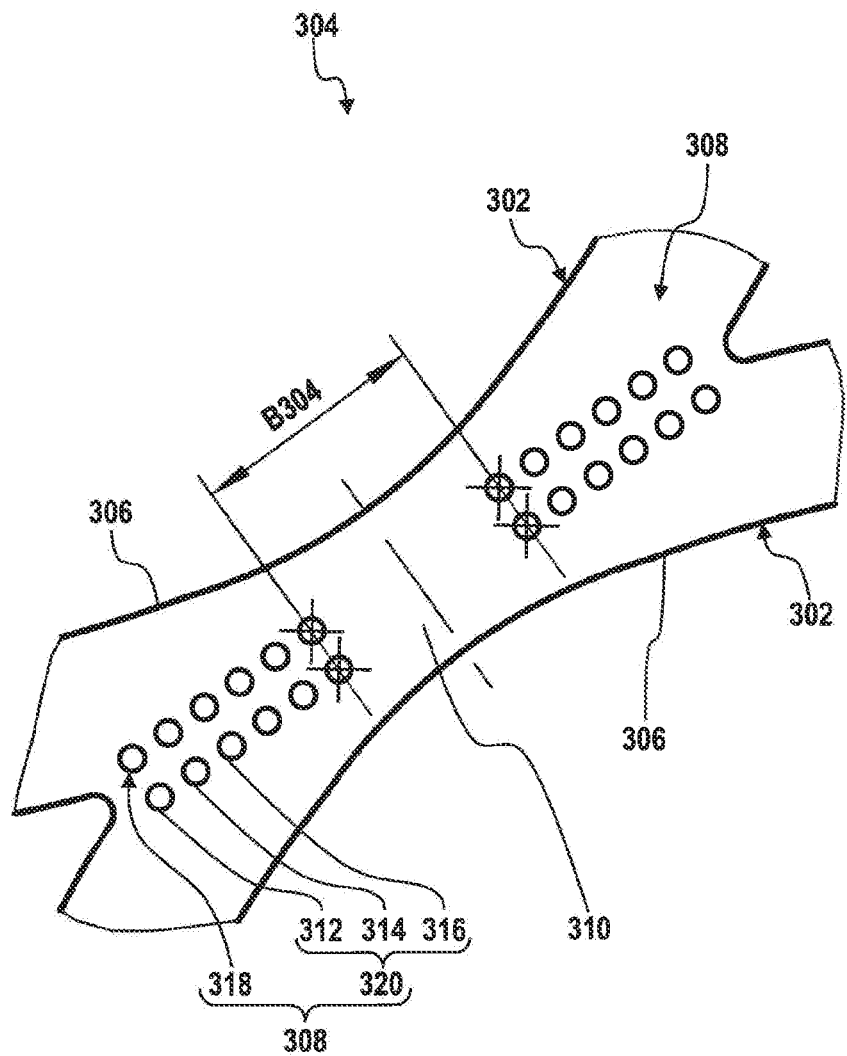
FIG. 13 shows a schematic detail view of an embodiment of a sealing device for the component in accordance with FIG. 2.

FIG. 13 shows once again the detail view IV in accordance with FIG. 7, but a development of the connection location 304 shown in FIG. 12 is illustrated in FIG. 13. In this case the yielding volumes 308 each include a plurality of rows 318, 320 of holes, which in turn have a multiplicity of holes 312, 314, 316 as explained above. The number of rows 318, 320 of holes is arbitrary. The holes 312, 314, 316 can be arranged in two rows, as shown in FIG. 13. However, the holes 312, 314, 316 can also be arranged in three rows or in four rows. The individual holes 312, 314, 316 of the rows 318, 320 of holes can be positioned next to one another, as shown in FIG. 13. However, the holes 312, 314, 316 can also be arranged offset with respect to one another.

Figure 14:
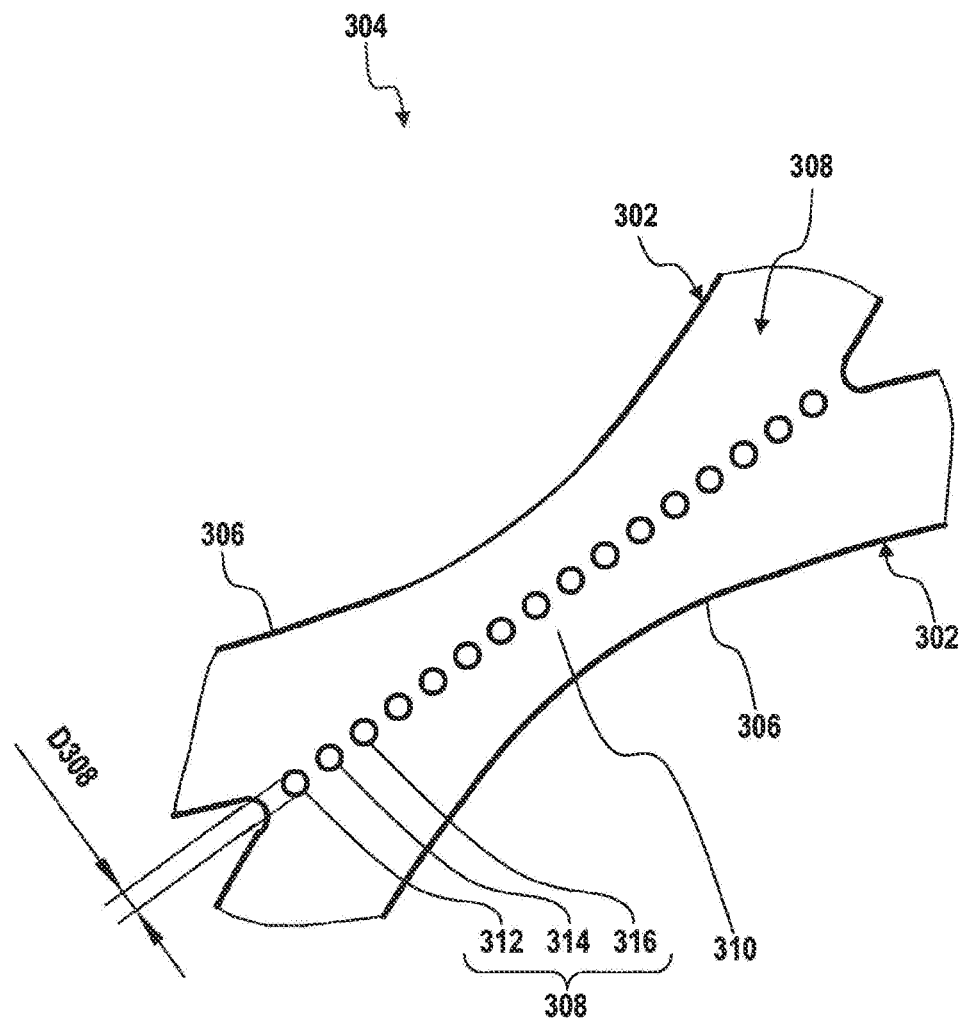
FIG. 14 shows a schematic detail view of an embodiment of a sealing device for the component in accordance with FIG. 2.

FIG. 14 shows once again the detail view IV in accordance with FIG. 7, but a development of the connection location 304 shown in FIG. 12 is illustrated in FIG. 14. In this embodiment of the connection location 304, the entire connection web 310 is provided with holes 312, 314, 316, such that only a single continuous yielding volume 308 formed from holes 312, 314, 316 is provided.

All configurations of the yielding volumes 308 explained above reliably enable pressing of the respective sealing ring 302 in the region of the connection locations 304. As a result, leaks directly in the course of mounting and over time can be reliably prevented. At the same time, as explained above, a centering of the sealing rings 302 on the base sections 214 of the second component parts 206 is always ensured on account of the trefoiled geometry of the inner contour 306.

Although the present disclosure has been described on the basis of illustrative embodiments, it is modifiable in diverse ways.

LIST OF REFERENCE SIGNS

100A EUV lithography apparatus
100B DUV lithography apparatus
102 Beam shaping and illumination system
104 Projection system
106A EUV light source
106B DUV light source
108A EUV radiation
108B DUV radiation
110 Mirror 112 Mirror
114 Mirror
116 Mirror
118 Mirror
120 Photomask
122 Mirror
124 Wafer
126 Optical axis
128 Lens element
130 Mirror
132 Medium
200 Component
202 Component part
204 Cooling system
206 Component part
208 Receiving portion
210 Sealing surface
212 Main body
214 Base section
216 Flange section
218 Axis of symmetry
220 Sealing surface
222 Ring body
224 Bearing portion
226 Yielding volume
300 Sealing device
302 Sealing ring
304 Connection location
306 Inner contour
308 Yielding volume
310 Connection web
312 Hole
314 Hole
316 Hole
318 Row of holes
320 Row of holes
A1 Distance
A2 Distance
A3 Distance
A4 Distance
A5 Distance
B304 Width
DA External diameter
DI Internal diameter
D308 Diameter
E1 Plane of symmetry
E2 Plane of symmetry
L1 Line of symmetry
L2 Line of symmetry
L3 Line of symmetry
MR11 Center point
MR12 Center point
MR21 Center point
MR22 Center point
MR304-1 Center point
MR304-2 Center point
MR304-3 Center point
MR304-4 Center point
M1 Mirror
M2 Mirror
M3 Mirror
M4 Mirror
M5 Mirror
M6 Mirror
RU Transition radius
R11 Intermediate radius
R12 Intermediate radius
R21 Intermediate radius
R22 Intermediate radius
R304 Connection radius
T308 Depth
U Circumferential direction
W300 Wall thickness
x x-direction
y y-direction
z z-direction
α Azimuth angle
β Azimuth angle
γ Azimuth angle

What is claimed is:

1. A device, comprising:
a multiplicity of connection locations; and
a multiplicity of sealing rings integrally connected to one another via the connection locations so that the multiplicity of connection locations and the multiplicity of sealing rings form a single piece,
wherein the device is configured to seal a first component part of a lithography apparatus with a multiplicity of second component parts of the lithography apparatus.

2. The device of claim 1, wherein each connection location comprises a yielding volume configured to press a respective sealing ring between the first component part and one of the second component parts.

3. The device of claim 2, wherein for each connection location:
the connection location comprises two yielding volumes;
the connection location comprises a connection web between the two yielding volumes; and
the connection web connects adjacent sealing rings to one another.

4. The device of claim 2, wherein the yielding volume comprises a groove at least partially penetrating into a wall thickness of the device.

5. The device of claim 2, wherein the yielding volume comprises a multiplicity of holes at least partially extending into a wall thickness of the device.

6. The device of claim 2, wherein for each connection location and respective sealing ring:
the sealing ring comprises an inner contour within which the one of the second component parts is able to be received at least in sections; and
the yielding volume is defined by the inner contour widening at the connection location.

7. The device of claim 6, wherein for each connection location and respective sealing ring:
the inner contour comprises a connection radius at the connection location;
the inner contour comprises an intermediate radius between the connection location and an adjacent connection location; and
the intermediate radius and the connection radius differ from one another in terms of their absolute value so that the inner contour widens at the connection location and the inner contour narrows between the connection location and the adjacent connection location.

8. The device of claim 7, wherein the intermediate radius is greater than the connection radius.

9. The device of claim 8, wherein the inner contour comprises a first intermediate radius and a second intermediate radius that has the same magnitude as the first intermediate radius.

10. The device of claim 8, wherein the inner contour comprises a first intermediate radius and a second intermediate radius that is larger than the first intermediate radius.

11. The device of claim 8, wherein:
the inner contour comprises a first intermediate radius and a second intermediate radius; and
two adjacent connection locations between which the first intermediate radius is provided and two adjacent connection locations between which the second intermediate radius is provided are spaced apart at the same distance or at different distances from one another.

12. The device of claim 8, wherein a center point of the intermediate radius is offset relative to a center point of the connection radius.

13. The device of claim 12, wherein:
the inner contour comprises a first intermediate radius and a second intermediate radius;
a center point of the first intermediate radius is offset relative to a center point of the connection radius in a first direction of the sealing ring and in a second direction of the sealing ring;
a center point of the second intermediate radius is offset relative to the center point of the connection radius in the first direction of the sealing ring and in the second direction of the sealing ring; and
the first direction of the sealing ring is perpendicular to the second direction of the sealing ring.

14. The device of claim 13, wherein:
center points of two first intermediate radii are spaced apart from one another by a first distance in the second direction of the sealing ring;
center points of two second intermediate radii are spaced apart from one another by a second distance in the first direction of the sealing ring; and the first and second distances are equal in magnitude or have different magnitudes.

15. The device of claim 14, wherein the first intermediate radii and the second intermediate radii alternate along the inner contour.

16. The device of claim 7, wherein the inner contour comprises a transition radius, and the intermediate radius transitions to the connection radius via the transition radius.

17. An apparatus, comprising:
a device according to claim 1,
wherein the apparatus is a lithography apparatus.

18. The device of claim 1, wherein the multiplicity of connection locations and the multiplicity of sealing rings comprise the same material.

19. A component, comprising:
a first component part;
a multiplicity of second component parts disposed in sections of the first component part; and
a device, comprising:
a multiplicity of connection locations; and
a multiplicity of sealing rings integrally connected to one another via the connection locations so that the multiplicity of connection locations and the multiplicity of sealing rings form a single piece,
wherein the device is configured to seal the first component part with the multiplicity of second component parts, and the component is a lithography component.

20. The component of claim 19, wherein, for each sealing ring, the sealing ring is pressed between the first component part and one of the second component parts so that material of the sealing ring at least partially fills a yielding volume of the device.

21. An apparatus, comprising:
a component according to claim 19,
wherein the apparatus is a lithography apparatus.

22. The apparatus of claim 19, wherein the multiplicity of connection locations and the multiplicity of sealing rings comprise the same material.

* * * * *

UNITED STATES PATENT AND TRADEMARK OFFICE
CERTIFICATE OF CORRECTION

| | | |
|---|---|---|
| PATENT NO. | : 11,740,562 B2 | |
| APPLICATION NO. | : 17/490197 | |
| DATED | : August 29, 2023 | |
| INVENTOR(S) | : Dieter Bader, Alexander Ostendorf and Ole Fluegge | |

It is certified that error appears in the above-identified patent and that said Letters Patent is hereby corrected as shown below:

In the Specification

Column 10, Line 60, after "line" insert -- III-III, --.

Column 15, Line 3, delete "a/360°" insert -- α/360° --.

In the Claims

Column 20, Line 32, Claim 22, delete "apparatus" insert -- device --.

Signed and Sealed this
Thirty-first Day of October, 2023

*Katherine Kelly Vidal*

Katherine Kelly Vidal
*Director of the United States Patent and Trademark Office*